(12) United States Patent
Zhang et al.

(10) Patent No.: US 8,759,179 B2
(45) Date of Patent: Jun. 24, 2014

(54) METHOD OF FORMING GATE PATTERN AND SEMICONDUCTOR DEVICE

(75) Inventors: Yiying Zhang, Shanghai (CN); Qiyang He, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 111 days.

(21) Appl. No.: 13/243,902

(22) Filed: Sep. 23, 2011

(65) Prior Publication Data

US 2012/0276727 A1 Nov. 1, 2012

(30) Foreign Application Priority Data

Apr. 29, 2011 (CN) .......................... 2011 1 0109827

(51) Int. Cl.
| | |
|---|---|
| *H01L 21/336* | (2006.01) |
| *H01L 21/4763* | (2006.01) |
| *H01L 29/94* | (2006.01) |
| *H01L 27/088* | (2006.01) |
| *H01L 29/78* | (2006.01) |
| *H01L 29/66* | (2006.01) |

(52) U.S. Cl.
CPC ....... *H01L 29/7831* (2013.01); *H01L 29/66825* (2013.01)
USPC .... 438/270; 438/585; 257/368; 257/E21.409; 257/E27.06

(58) Field of Classification Search
CPC ..................... H01L 29/7831; H01L 29/66825
USPC .................. 438/270, 585; 257/368, E21.409, 257/E27.06
See application file for complete search history.

(56) References Cited

U.S. PATENT DOCUMENTS

| | | | |
|---|---|---|---|
| 6,042,998 A | 3/2000 | Brueck et al. | |
| 6,812,534 B2 * | 11/2004 | Ishigaki et al. | ............... 257/401 |
| 7,221,031 B2 * | 5/2007 | Ryoo et al. | .................... 257/393 |
| 7,465,973 B2 * | 12/2008 | Chang et al. | .................. 257/206 |
| 2005/0164455 A1 * | 7/2005 | Jang et al. | ..................... 438/270 |
| 2009/0034317 A1 * | 2/2009 | Tomita et al. | ................. 365/104 |

* cited by examiner

*Primary Examiner* — Luan C Thai
(74) *Attorney, Agent, or Firm* — Koppel, Patrick, Heybl & Philpott; Michael J. Ram

(57) ABSTRACT

This disclosure relates to a method of forming a gate pattern and a semiconductor device. The gate pattern comprises a plurality of parallel gate bars, and each gate bar is broken up by gaps. The method comprises: making an etching characteristic of a gate material layer at least at positions where the gaps are to be formed different from that at remaining positions; forming a plurality of parallel openings in a second resist layer; performing a first etching process on the gate material layer with the second resist layer as a mask, wherein portions of the gate material layer at least at the positions where the gaps are to be formed are selectively left; and performing a second etching process on the gate material layer so as to selectively remove the portions. This method can more accurately control the shape and size of the gate pattern.

18 Claims, 18 Drawing Sheets

METHOD OF FORMING GATE PATTERN AND SEMICONDUCTOR DEVICE

CROSS-REFERENCE TO RELATED APPLICATIONS

This application claims priority to Chinese Patent Application No. 201110109827.2, filed on Apr. 29, 2011 and entitled "Method of Forming Gate Pattern and Semiconductor Device", which is incorporated herein by reference in its entirety.

BACKGROUND OF THE INVENTION

1. Field of the Invention

This disclosure relates to a semiconductor device manufacturing field, and in particular relates to a method of forming a gate pattern and a semiconductor device having the gate pattern.

2. Description of the Related Art

It is often needed to form a gate pattern as shown in FIG. 1 in semiconductor integrated circuits. More specifically, such a gate pattern comprises a plurality of gate bars parallel to each other in a first direction, and each gate bar is broken up by gaps.

In a modern semiconductor manufacturing process, as the size of semiconductor devices deceases, the gate pattern is generally hard to be formed by a single patterning. Therefore, in order to form the gate pattern as shown in FIG. 1, a double patterning technique is employed widely.

FIGS. 2A-2D schematically illustrate a method of forming the gate pattern by employing a conventional double patterning technique.

First, as shown in FIG. 2A, a resist pattern 210, which has a plurality of openings parallel to each other and extending continuously, is formed by a first patterning process. Next, as shown in FIG. 2B, a first etching process is performed with the resist pattern 210 as a mask so as to form on a substrate 250 a plurality of gate material bars 260 parallel to each other and extending continuously. Then, as shown in FIG. 2C, a resist pattern 220 having trimming slots is formed by a second patterning process. The positions of the trimming slots correspond to the positions of the gaps breaking up the gate bars. Finally, as shown in FIG. 2D, a second etching process is performed with the resist pattern 220 as a mask so as to form the gaps in the plurality of gate material bars 260 parallel to each other which are obtained after line etching, thereby the gate pattern as shown in FIG. 1 is formed.

The present inventors have conducted in-depth investigation on the above method of forming the gate pattern, and have found that there exist some problems.

For example, as the size of semiconductor devices keeps decreasing, the obtained trimming slot patterns deviate from the designed patterns due to a margin of trimming slot patterning. Furthermore, after performing trimming slot etching by using the deviated trimming slot patterns, deviation between the obtained gate pattern and the designed pattern is more remarkable, whereas it is very difficult to modify such deviation. In this way, the shape and size of the gate pattern cannot be accurately controlled, thereby an adverse effect on the performance of semiconductor devices is caused.

SUMMARY OF THE INVENTION

This disclosure is proposed in view of the above problems.

An object of this disclosure is to provide a method of fanning a gate pattern and a semiconductor device having the gate pattern, wherein the method of forming the gate pattern can control the shape and size of the gate pattern more accurately compared with prior art methods.

According to a first aspect of this disclosure, there is provided a method of forming a gate pattern, the gate pattern comprising a plurality of gate bars parallel to each other in a first direction, each gate bar being broken up by gaps, wherein the method comprises the following steps: forming a gate material layer on a substrate; making an etching characteristic of the gate material layer at least at positions where the gaps are to be formed different from an etching characteristic of the gate material layer at remaining positions; forming a second resist layer on the gate material layer on the substrate; performing a second patterning process on the second resist layer so as to form a plurality of openings parallel to each other and extending continuously in the first direction; performing a first etching process on the gate material layer with the second resist layer after the second patterning process as a mask, wherein portions of the gate material layer at least at the positions where the gaps are to be formed are selectively left; and performing a second etching process on the gate material layer so as to selectively remove the portions of the gate material layer at least at the positions where the gaps are to be formed.

Preferably, the step of making an etching characteristic of the gate material layer at least at positions where the gaps are to be formed different from an etching characteristic of the gate material layer at remaining positions comprises: performing implantation or oxidization on the gate material layer at least at the positions of the gate material layer where the gaps are to be formed.

Preferably, the step of making an etching characteristic of the gate material layer at least at positions where the gaps are to be formed different from an etching characteristic of the gate material layer at remaining positions comprises: forming a first resist layer on the gate material layer on the substrate; performing a first patterning process on the first resist layer so as to expose at least the positions of the gate material layer where the gaps are to be formed; and performing implantation or oxidization on the gate material layer with the first resist layer after the first patterning process as a mask.

Preferably, the step of making an etching characteristic of the gate material layer at least at positions where the gaps are to be formed different from an etching characteristic of the gate material layer at remaining positions comprises: performing implantation or oxidization on the gate material layer at the remaining positions of the gate material layer.

Preferably, the step of making an etching characteristic of the gate material layer at least at positions where the gaps are to be formed different from an etching characteristic of the gate material layer at remaining positions comprises: forming a first resist layer on the gate material layer on the substrate; performing a first patterning process on the first resist layer so as to expose the remaining positions of the gate material layer; and performing implantation or oxidization on the gate material layer with the first resist layer after the first patterning process as a mask.

Preferably, an implanted impurity is selected from C, Ge, B, P and As when performing implantation.

Preferably, an etching selection ratio in the first etching process is larger than 2:1.

Preferably, an etching selection ratio in the second etching process is larger than 10:1.

Preferably, the at least the positions of the gate material layer where the gaps are to be formed comprise positions where a plurality of adjacent gaps are regarded as one integrated gap.

Preferably, the gate material layer is a polysilicon layer.

Preferably, the material of the gate bars is replaced with a metal after forming the gate pattern.

Preferably, a hard mask layer is formed on the gate material layer; each of the steps is executed on the hard mask layer rather than on the gate material layer; and the method of forming the gate pattern further comprises: forming the gate pattern by a third etching process with the hard mask layer after the second etching process as a mask.

Preferably, the hard mask layer is a silicon nitride layer, a silicon oxide layer or a polymer layer.

According to a second aspect of this disclosure, there is provided a semiconductor device, the semiconductor device having a gate pattern, the gate pattern comprising a plurality of gate bars parallel to each other in a first direction, and each gate bar to be broken up by gaps, wherein a gate bar material is disposed at least at positions of the gaps, and an etching characteristic of the gate bar material is different from an etching characteristic of the gate bars.

Preferably, the positions of the gaps comprise positions where a plurality of adjacent gaps are regarded as one integrated gap.

Preferably, an implanted impurity is contained in the gate bars or the gate bar material.

Preferably, the gate bars have undergone oxidization or the gate bar material has undergone oxidization.

According to each of the above aspects of this disclosure, a method of forming a gate pattern and a semiconductor device having the gate pattern can be provided, wherein the method of forming the gate pattern can control the shape and size of the gate pattern more accurately compared with prior art methods.

BRIEF DESCRIPTION OF THE DRAWINGS

The accompanying drawings, which are incorporated in and constitute a part of the specification, illustrate embodiments of this disclosure and, together with the description, serve to explain the principles of this disclosure.

It is to be noted that, in the accompanying drawings, for convenience of description, the sizes of respective components may not be drawn based on actual scales.

FIGS. 6A-6L schematically illustrate respective steps in the method of forming the gate pattern according to the first example of this disclosure, wherein FIGS. 6A, 6C, 6E, 6G, 6I and 6K are plan views, and FIGS. 6B, 6D, 6F, 6H, 6J and 6L are corresponding sectional views thereof (taken along the dotted lines in the corresponding plan views), respectively.

FIGS. 7A-7L schematically illustrate respective steps in the method of forming the gate pattern according to the second example of this disclosure, wherein FIGS. 7A, 7C, 7E, 7G, 7I and 7K are plan views, and FIGS. 7B, 7D, 7F, 7H, 7J and 7L are corresponding sectional views thereof (taken along the dotted lines in the corresponding plan views), respectively.

The objects, features and advantages of this disclosure will become apparent from the following detailed description of exemplary embodiments with reference to the accompanying drawings.

DESCRIPTION OF THE EMBODIMENTS

Exemplary embodiments of this disclosure will be described in detail below with reference to the accompanying drawings. It shall be noted that the following description is merely illustrative in nature. The components and steps set forth in the embodiments do not limit the scope of this disclosure unless it is otherwise specifically stated. In addition, techniques, methods and devices known by persons skilled in the art may not be discussed in detail, but are intended to be a part of the specification where appropriate.

First Embodiment

Figure 1:
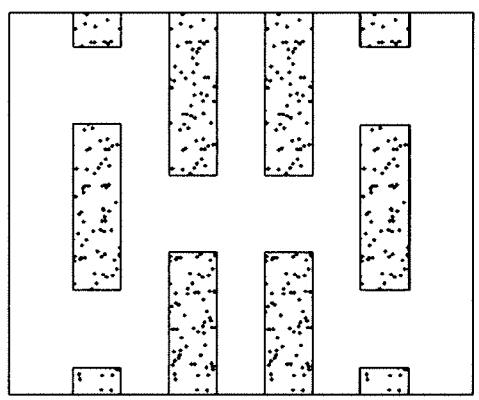
FIG. 1 illustrates a gate pattern.
Figure 3:
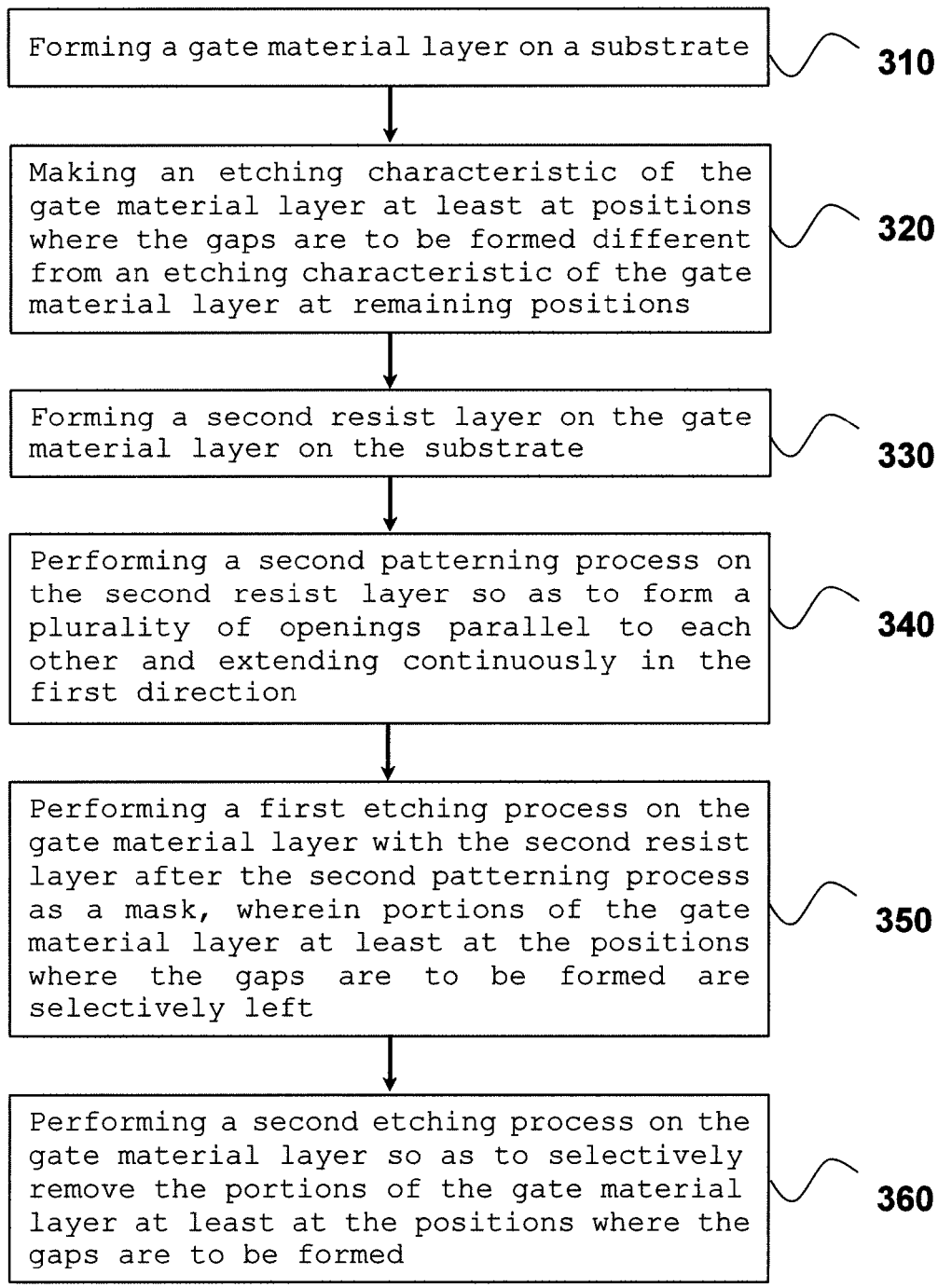
FIG. 3 is a flowchart schematically illustrating a method of forming a gate pattern according to a first embodiment of this disclosure.

In a first embodiment of this disclosure, in order to form the gate pattern as shown in FIG. 1, first, an etching characteristic of a gate material layer at least at positions where gaps are to be formed is made different from an etching characteristic of the gate material layer at remaining positions, then a line etching for gate material bars is performed, and finally the portions of the gate material layer at least at the positions where the gaps are to be formed are selectively removed (referring to FIG. 3). The first embodiment of this disclosure will be described in detail below through a first example and a second example.

First Example

In the first example of this disclosure, the etching characteristic of the gate material layer at least at the positions where the gaps are to be formed is made different from the etching characteristic of the gate material layer at the remaining positions by processing the gate material layer at least at the positions of the gate material layer where the gaps are to be formed.

Figure 4:
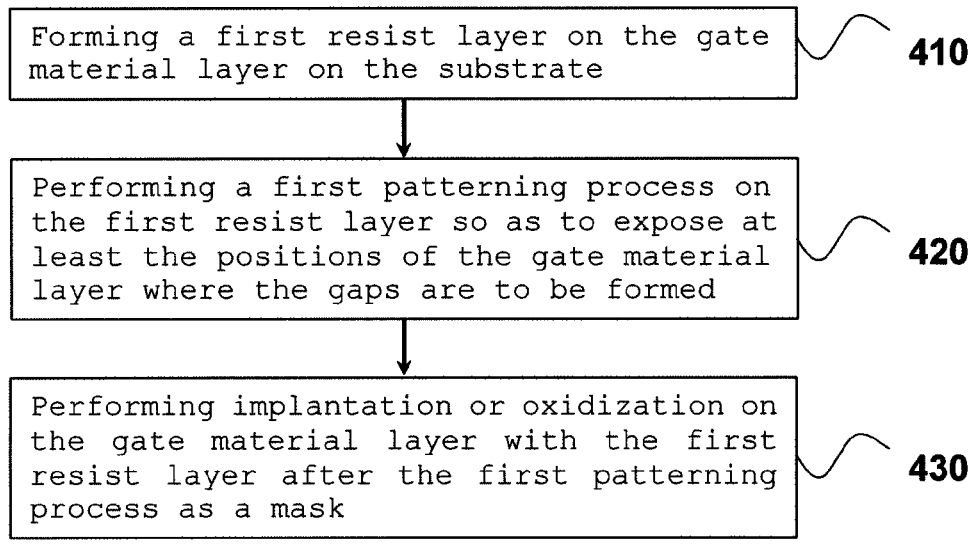
FIG. 4 is a flowchart schematically illustrating a method of making an etching characteristic of the gate material layer at least at positions where the gaps are to be formed different from an etching characteristic of the gate material layer at remaining positions according to a first example of this disclosure.

FIGS. 3 and 4 are flowcharts schematically illustrating a method of forming a gate pattern according to the first example of this disclosure. FIGS. 6A-6L are plan views and sectional views schematically illustrating respective steps in the method of forming the gate pattern according to the first example of this disclosure. The first example of this disclosure will be described in detail blow with reference to FIGS. 3, 4 and 6A-6L.

First, in step 310 of FIG. 3, a gate material layer 660 is formed on a substrate 650. A thin gate oxide layer (not shown in the drawings), for example, may be provided on the substrate 650. The gate material layer 660 may be, for example, a polysilicon layer, but is not limited thereto.

Next, in step 320 of FIG. 3, the etching characteristic of the gate material layer 660 at least at the positions where the gaps are to be formed is made different from the etching characteristic of the gate material layer 660 at the remaining positions. In the first example, this can be obtained by steps 410-430 in FIG. 4.

Specifically, in step 410 of FIG. 4, a first resist layer 610 is formed on the gate material layer 660 on the substrate 650.

Figure 6A:
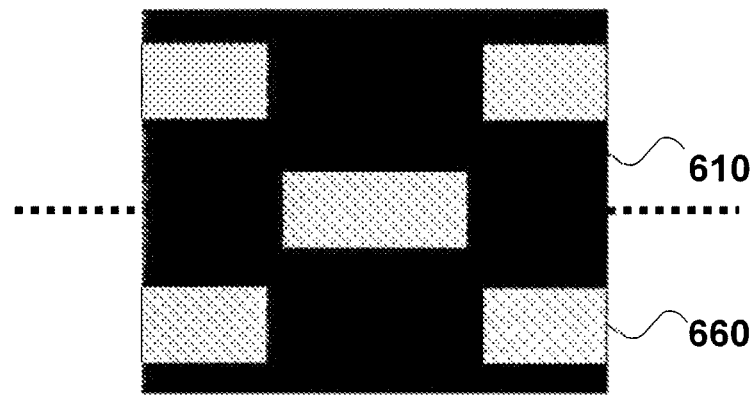
Figure 6B:
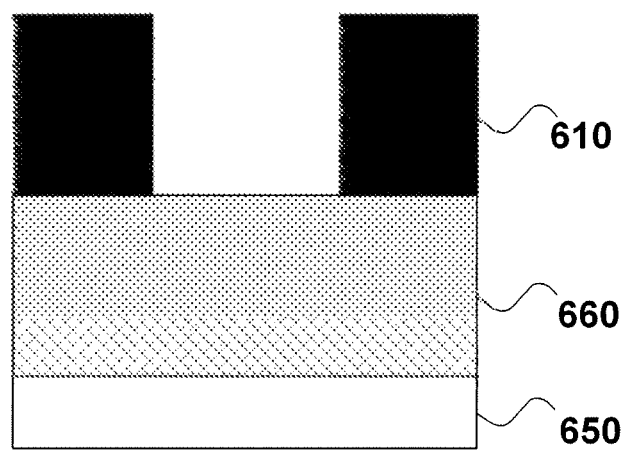

In step 420 of FIG. 4, a first patterning process is performed on the first resist layer 610 so as to expose at least the positions of the gate material layer 660 where the gaps are to be formed (referring to FIGS. 6A-6B). The first patterning process may, for example, employ techniques known to persons skilled in the art, such as a photolithography process or an imprinting process etc. Moreover, the first patterning process may, for example, comprise multiple patterning processes forming a plurality of patterns as needed.

Figure 2A:
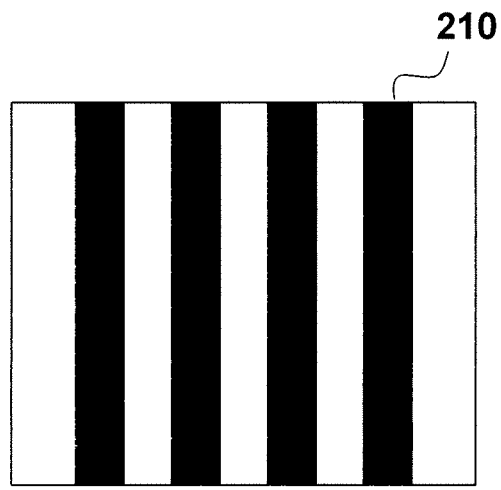
FIGS. 2A-2D schematically illustrate a method of forming the gate pattern by employing a conventional double patterning technique.
Figure 2B:
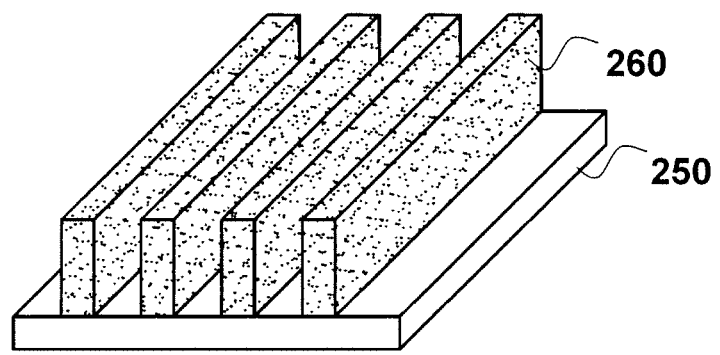
Figure 2C:
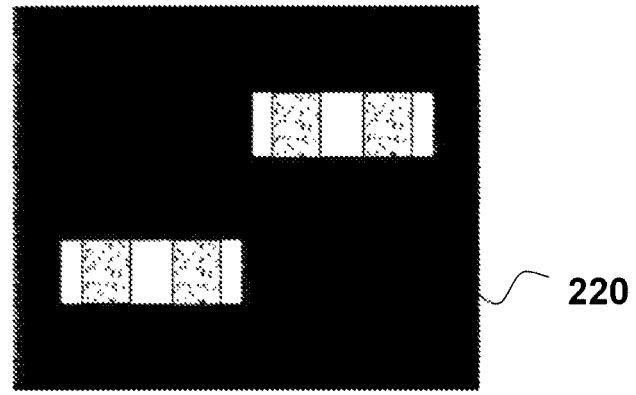
Figure 2D:
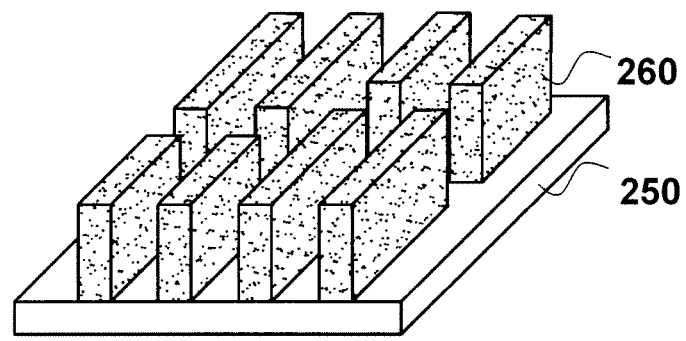

It can be seen by comparing FIGS. 2C and 6A that, the at least the positions of the gate material layer 660 where the gaps are to be formed correspond to the positions of the trimming slots in the conventional double patterning technique, that is, the first patterning process in the first example is similar to the second patterning process in the conventional double patterning technique. However, it can be seen from the following description that, in the first example, the gate material layer is not etched subsequently after the first patterning process; whereas in the conventional double patterning technique, the gate material layer is etched subsequently after the second patterning process.

Incidentally, the positions of the gate material layer 660 where the gaps are to be formed may be positions where a plurality of adjacent gaps are regarded as one integrated gap. FIG. 6A illustrates a case where two adjacent gaps are regarded as one integrated gap. However, the number of the plurality of adjacent gaps is not limited particularly, and it may be, for example, 1 to 5, which mainly depends on the desired gate pattern.

Figure 6C:
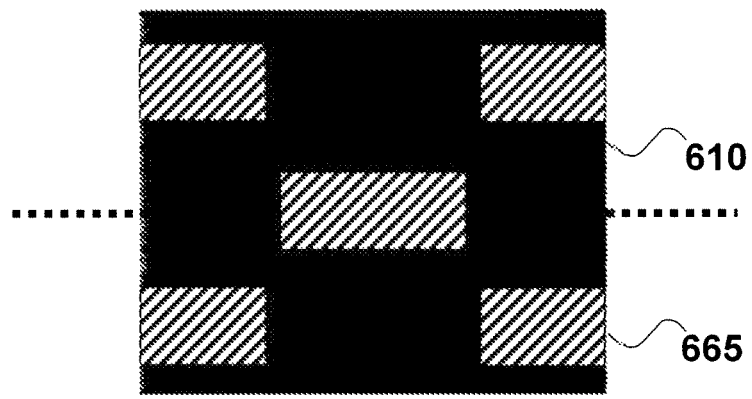
Figure 6D:
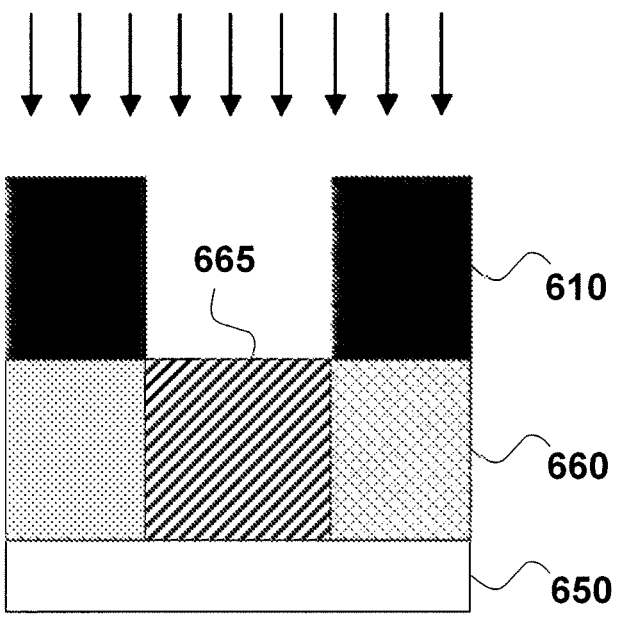

In step 430 of FIG. 4, the gate material layer 660 is processed with the first resist layer 610 after the first patterning process as a mask so that the etching characteristic of the gate material layer 660 at least at the positions where the gaps are to be formed becomes different from the etching characteristic of the gate material layer 660 at the remaining positions (referring to FIGS. 6C-6D).

FIG. 6D illustrates performing an implanting process on the gate material layer 660. A specific type of the implanting process is not limited particularly, and it may be, for example, pre-amorphization implant or cluster ion implant etc. Moreover, an implanted impurity is not limited particularly, and it may be, for example, selected from C, Ge, B, P and As etc. As long as the etching characteristic of the implanted gate material layer 665 becomes different from the etching characteristic of the un-implanted gate material layer 660 (i.e., the etching characteristic of the gate material layer at least at the positions where the gaps are to be formed becomes different from the etching characteristic of the gate material layer at the remaining positions), the type of the implanting process and the implanted impurity may be any suitable type and species.

In addition, a process for changing the etching characteristic of the gate material layer is not limited to the above described implanting process, and it may also be, for example, an oxidizing process etc. As long as the etching characteristic of the processed gate material layer 665 becomes different from the etching characteristic of the unprocessed gate material layer 660 (i.e., the etching characteristic of the gate material layer at least at the positions where the gaps are to be formed becomes different from the etching characteristic of the gate material layer at the remaining positions), the process for changing the etching characteristic of the gate material layer may be any suitable process.

Figure 6E:
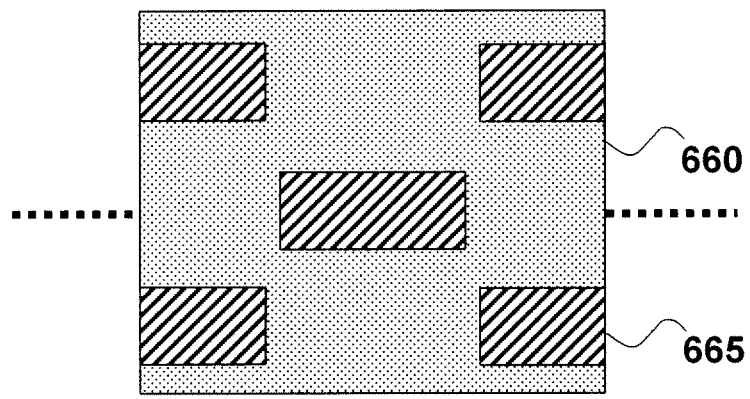
Figure 6F:
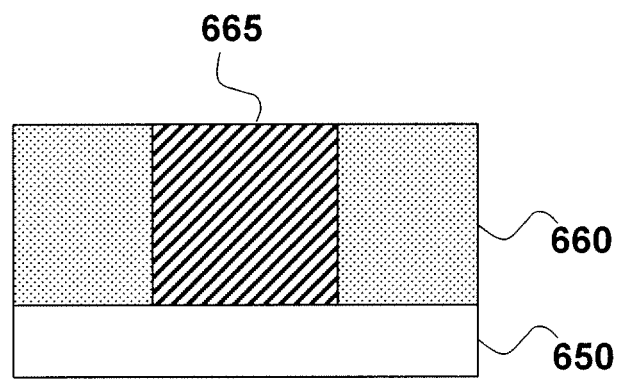

FIGS. 6E-6F are plan views and sectional views illustrating the gate material layer after the first resist layer 610 is stripped. At this time, the gate material layer comprises the processed gate material layer 665 at least at the positions where the gaps are to be formed and the unprocessed gate material layer 660 at the remaining positions, and the gate material layer 665 and the gate material layer 660 have the same thickness.

Returning to FIG. 3, then in step 330 of FIG. 3, a second resist layer 620 is formed on the gate material layer on the substrate 650.

Figure 6G:
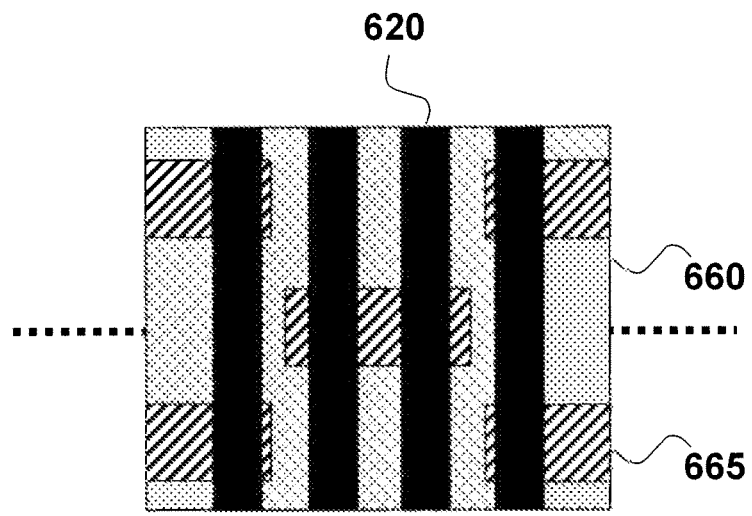
Figure 6H:
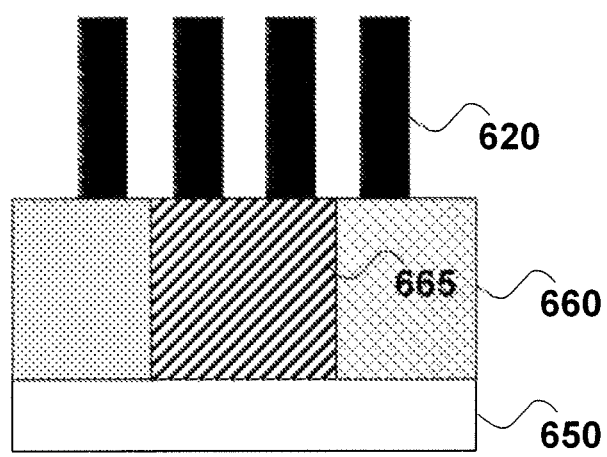

In step 340 of FIG. 3, a second patterning process is performed on the second resist layer 620 so as to form a plurality of openings parallel to each other and extending continuously in the first direction (referring to FIGS. 6G-6H). The second patterning process may also, for example, employ techniques known to persons skilled in the art, such as a photolithography process or an imprinting process etc. Moreover, the second patterning process may also, for example, comprise multiple patterning processes forming a plurality of patterns as needed. In addition, the second patterning process is a patterning process of a line/space type, which is similar to the first patterning process in the conventional double patterning technique (comparing FIGS. 2A and 6G).

In step 350 of FIG. 3, a first etching process is performed on the gate material layer with the second resist layer 620 after the second patterning process as a mask. Since the etching characteristic of the processed gate material layer 665 is different from the etching characteristic of the unprocessed gate material layer 660, during the first etching process, among the portions of the gate material layer not masked by the second resist layer 620, the unprocessed gate material layer 660 may be made to be selectively etched away, whereas the processed gate material layer 665 is made to be selectively left. In this way, after the first etching process, a plurality of gate material bars parallel to each other and extending continuously in the first direction are formed on the substrate 650, however, the processed gate material layer 665 at least at the positions of the gate material layer where the gaps are to be formed is selectively left (referring to FIGS. 6I-6J). The first etching process is a dry etching process. In the first etching process, an etching selection ratio of the unprocessed gate material layer 660 to the processed gate material layer 665 is, for example, larger than 2:1.

Then in step 360 of FIG. 3, a second etching process is performed on the gate material layer so as to selectively remove the portions of the gate material layer at least at the positions where the gaps are to be formed. Since the etching characteristic of the processed gate material layer 665 is different from the etching characteristic of the unprocessed gate material layer 660, during the second etching process, the processed gate material layer 665 can be made to be selectively etched away (i.e., the portions of the gate material layer at least at the positions where the gaps are to be formed are selectively removed), whereas the unprocessed gate material layer 660 is made to be selectively left. In this way, after the second etching process, the gate pattern as shown in FIG. 1 is formed (referring to FIGS. 6K-6L). According to specific situations, the second etching process may be a dry etching process or a wet etching process with a relatively lower cost, which is different from the fact that the second etching process (trimming slot etching) in the conventional double patterning technique can only be a dry etching process. In the second etching process, an etching selection ratio of the processed gate material layer 665 to the unprocessed gate material layer 660 is, for example, larger than 10:1.

After forming the gate pattern, optionally, the material of the gate bars may be further replaced with a metal so as to form a metal gate pattern (i.e., the gate material layer 660 is used as a dummy gate material layer). In addition, optionally, the gate oxide layer may be further replaced with a high-K dielectric layer (i.e., the gate oxide layer is used as a dummy gate oxide layer).

Figure 6I:
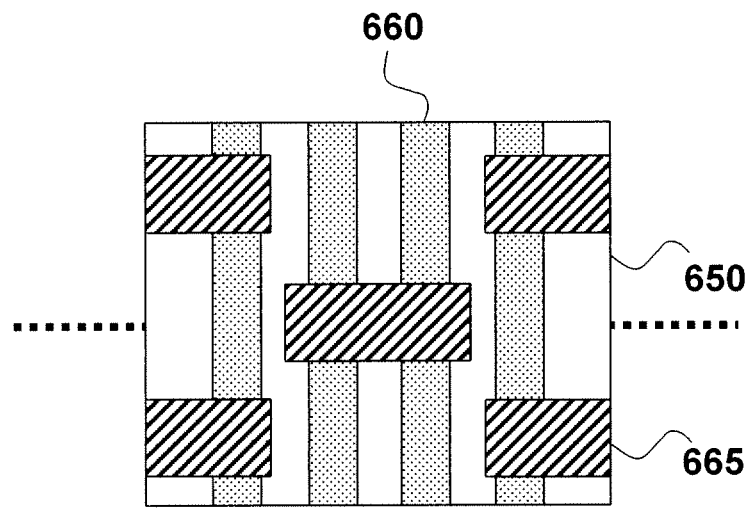
Figure 6J:
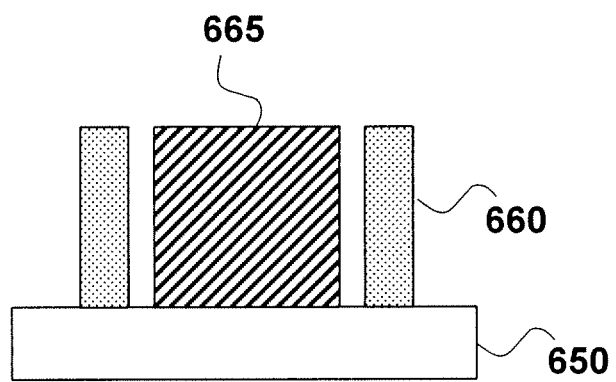
Figure 6K:
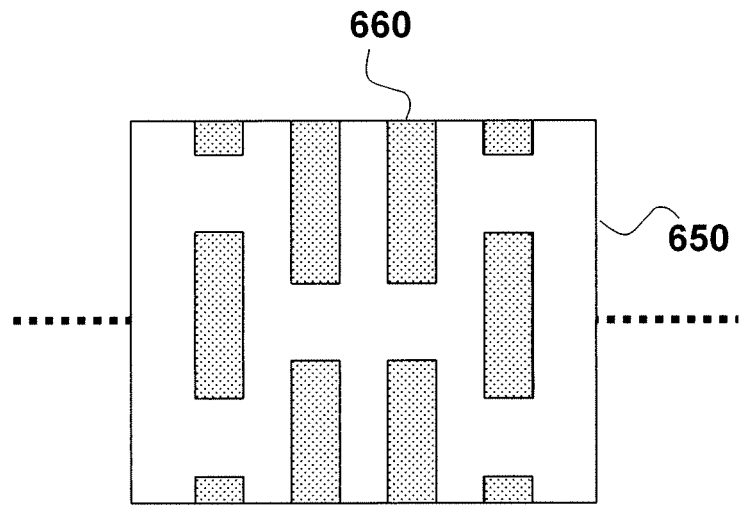
Figure 6L:
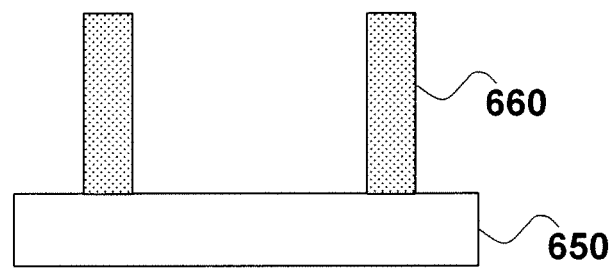

According to the method of the first example of this disclosure as described above, a semiconductor device may be formed, the semiconductor device having a gate pattern, the gate pattern comprising a plurality of gate bars parallel to each other in a first direction, and each gate bar to be broken up by gaps, wherein a gate bar material is disposed at least at positions of the gaps, and an etching characteristic of the gate bar material is different from an etching characteristic of the gate bars. Referring to FIGS. 6I-6J, for example, an implanted impurity is contained in the gate bar material or the gate bar material has undergone oxidization.

By comparing the method of forming the gate pattern of the first example of this disclosure in FIGS. 6A-6L with the conventional double patterning technique in FIGS. 2A-2D, it can be seen that, the first patterning process in the first example of this disclosure corresponds to the second patterning process in the conventional double patterning technique, both being used for exposing the positions of the gate material layer where the gaps are to be formed; moreover, the second patterning process in the first example of this disclosure corresponds to the first patterning process in the conventional double patterning technique, both being used for performing the line etching for gate material bars.

However, in the first example of this disclosure, the order of the two patterning processes in the conventional double patterning technique is reversed; moreover, after the first patterning process, the gate material layer is not etched subsequently so as to remove at least the positions of the gate material layer where the gaps are to be formed, instead, the etching characteristic of the gate material layer at least at the positions where the gaps are to be formed is changed so that it is different from the etching characteristic of the gate material layer at the remaining positions. In this way, when the second patterning process in the first example of this disclosure is to be performed, since the underlying gate material layer is planar (referring to FIGS. 6F and 6H), a leveling process by a leveling agent (such as BARC etc.) does not have to be performed. The omission of the leveling process not only saves process steps and cost, but also makes the patterning process effect of the resist better, thereby more accurate control of the shape and size of the gate pattern to be formed is facilitated. In comparison to this, when the second patterning process in the conventional double patterning technique is to be performed, since the underlying gate material layer has been formed into gate material bars, a leveling process has to be performed (referring to FIGS. 2B-2C).

In addition, in the first example of this disclosure, as for the first patterning process for forming slot-like openings that is harder to be achieved in process, the underlying gate material layer is also planar (referring to FIG. 6B), so a leveling process does not have to be performed too. Moreover, after the at least the positions of the gate material layer where the gaps are to be formed are exposed by the first patterning process, etching is not performed subsequently so as to remove the gate material layer at the positions, instead, only the etching characteristic of the gate material layer at the positions is changed. In this way, pattern transfer of slot-like openings that is harder to be achieved in process is performed only once in the first example of this disclosure (i.e., only the patterning process is performed), unlike the case in the conventional double patterning technique in which pattern transfer of slot-like openings that is harder to be achieved in process is performed twice successively (i.e., both the patterning process and the etching process are performed). This also helps to more accurately control the shape and size of the gate pattern to be formed. In addition, when the etching characteristic of the gate material layer at the positions is changed by implantation, it will further help to more accurately control the shape and size of the gate pattern to be formed.

In addition, in the first example of this disclosure, the second etching process may be a dry etching process or a wet etching process (referring to FIGS. 6I-6L). In comparison to this, in the conventional double patterning technique, the second etching process can only be a dry etching process (referring to FIGS. 2C-2D). In this way, the second etching process in the first example of this disclosure has a larger process freedom, and a suitable etching process can be selected according to actual situations.

Second Example

In a second example of this disclosure, by processing the gate material layer at the remaining positions of the gate material layer which exclude the positions where the gaps are to be formed, the etching characteristic of the gate material layer at least at the positions where the gaps are to be formed is made different from the etching characteristic of the gate material layer at the remaining positions.

Figure 5:
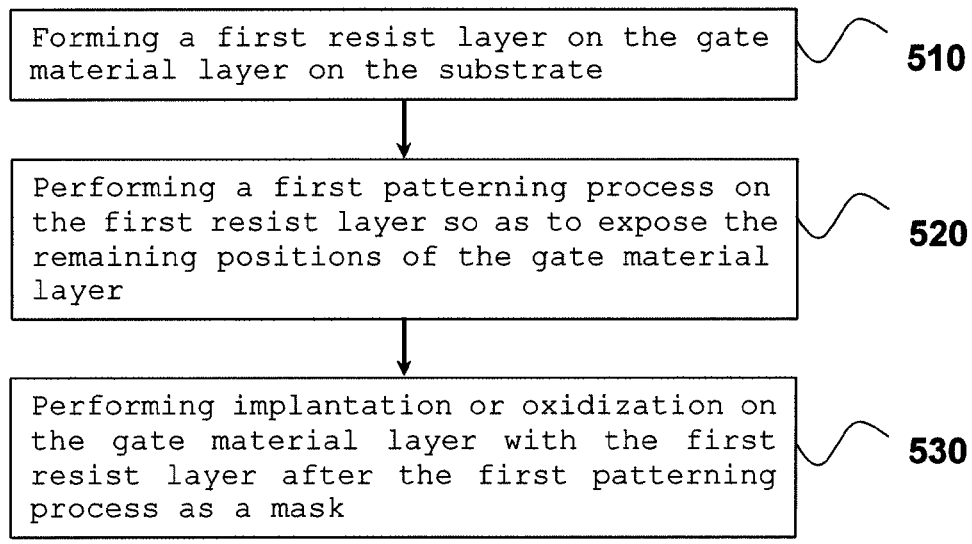
FIG. 5 is a flowchart schematically illustrating a method of making an etching characteristic of the gate material layer at least at positions where the gaps are to be formed different from an etching characteristic of the gate material layer at remaining positions according to a second example of this disclosure.

FIGS. 3 and 5 are flowcharts schematically illustrating a method of forming a gate pattern according to the second example of this disclosure. FIGS. 7A-7L are plan views and sectional views schematically illustrating respective steps in the method of forming the gate pattern according to the second example of this disclosure, wherein portions similar to those in FIGS. 6A-6L according to the first example are denoted by similar reference signs. The second example of this disclosure will be described below with reference to FIGS. 3, 5 and 7A-7L, wherein only the difference between the second example and the first example will be described in detail; other parts of the second example are similar to those in the first example, and description of the first example may be referred to for details.

First, in step 310 of FIG. 3, a gate material layer 760 is formed on a substrate 750. A thin gate oxide layer (not shown in the drawings), for example, may be provided on the substrate 750. The gate material layer 760 may be, for example, a polysilicon layer, but is not limited thereto.

Next, in step 320 of FIG. 3, an etching characteristic of the gate material layer 760 at least at positions where the gaps are to be formed is made different from an etching characteristic of the gate material layer 760 at remaining positions. In the second example, this can be obtained by steps 510-530 in FIG. 5.

Specifically, in step 510 of FIG. 5, a first resist layer 710 is formed on the gate material layer 760 on the substrate 750.

Figure 7A:
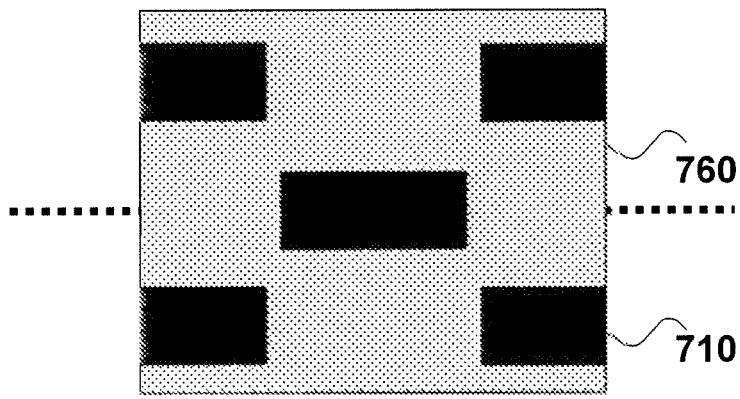
Figure 7B:
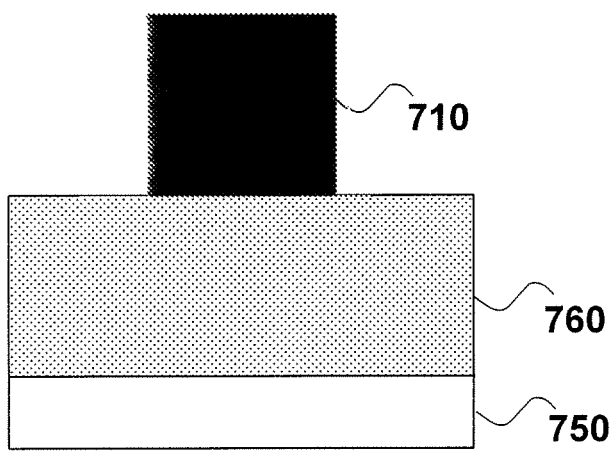

In step 520 of FIG. 5, a first patterning process is performed on the first resist layer 710 so as to expose the remaining positions of the gate material layer 760 which exclude the positions where the gaps are to be formed (referring to FIGS. 7A-7B).

Incidentally, the at least the positions of the gate material layer 760 where the gaps are to be formed may be positions where a plurality of adjacent gaps are regarded as one integrated gap.

Figure 7C:
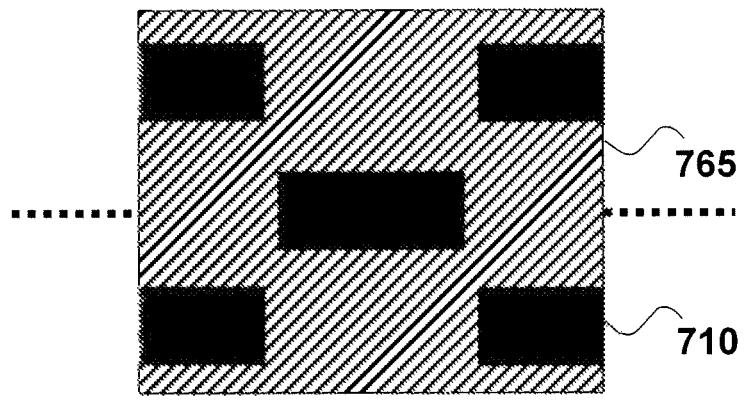
Figure 7D:
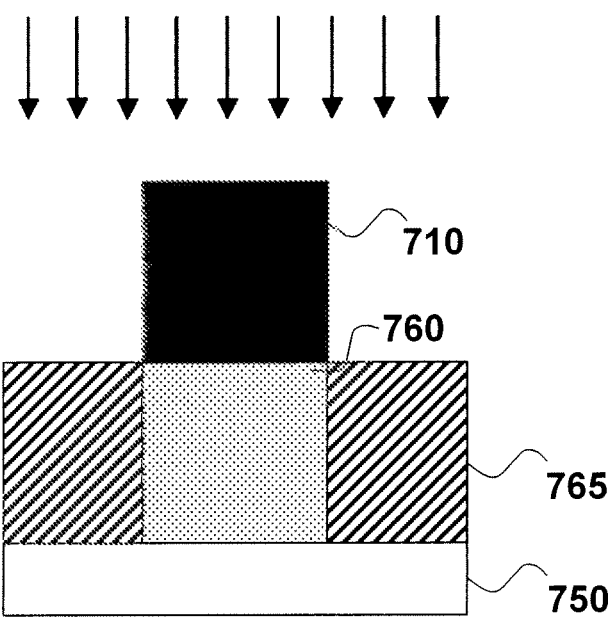

In step 530 of FIG. 5, the gate material layer 760 is processed with the first resist layer 710 after the first patterning process as a mask so that the etching characteristic of the gate material layer at the remaining positions becomes different from the etching characteristic of the gate material layer at least at the positions where the gaps are to be formed (referring to FIGS. 7C-7D). FIG. 7D illustrates performing an implanting process on the gate material layer 760. A specific type of the implanting process is not limited particularly, and it may be, for example, pre-amorphization implant or cluster ion implant etc. An implanted impurity is not limited particularly, and it may be, for example, selected from C, Ge, B, P and As etc. Moreover, as described above, a processing for changing the etching characteristic of the gate material layer is not limited particularly too, and it may also be, for example, an oxidizing process etc.

Figure 7E:
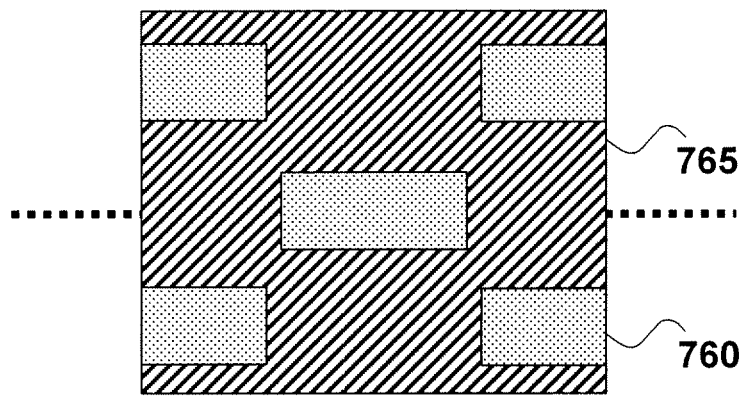
Figure 7F:
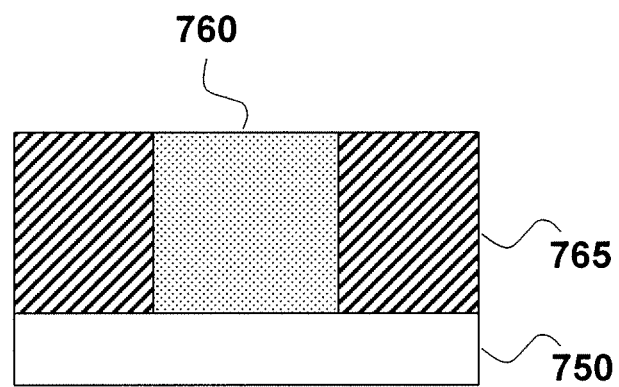

FIGS. 7E-7F are plan views and sectional views illustrating the gate material layer after the first resist layer 710 is stripped. At this time, the gate material layer comprises the unprocessed gate material layer 760 at least at the positions where the gaps are to be formed and the processed gate material layer 765 at the remaining positions. In comparison to this, in the first example, the gate material layer comprises the processed gate material layer 665 at least at the positions where the gaps are to be formed and the unprocessed gate material layer 660 at the remaining positions (referring to FIGS. 6E-6F).

Returning to FIG. 3, then in step 330 of FIG. 3, a second resist layer 720 is formed on the gate material layer on the substrate 750.

Figure 7G:
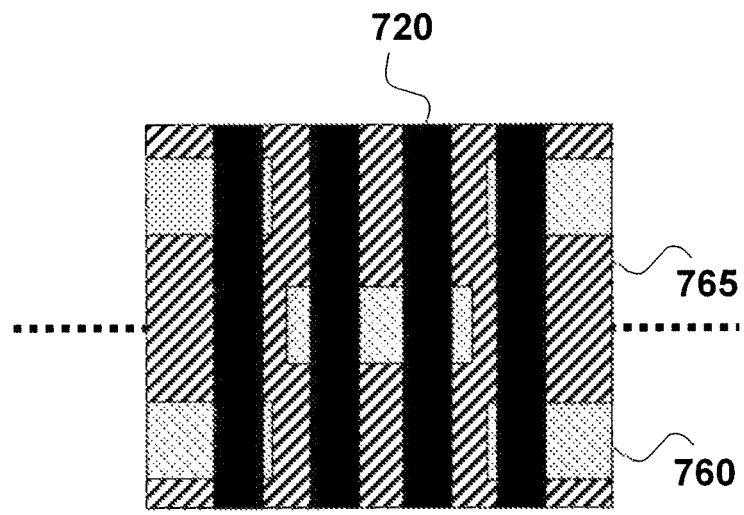
Figure 7H:
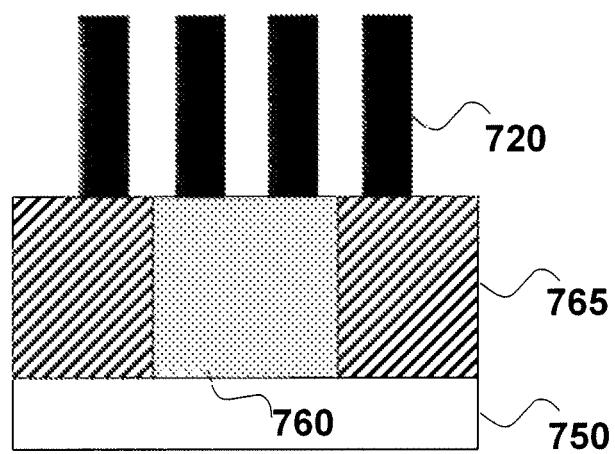

In step 340 of FIG. 3, a second patterning process is performed on the second resist layer 720 so as to form a plurality of openings parallel to each other and extending continuously in the first direction (referring to FIGS. 7G-7H).

In step 350 of FIG. 3, a first etching process is performed on the gate material layer with the second resist layer 720 after the second patterning process as a mask. After the first etching process, a plurality of processed gate material bars parallel to each other and extending continuously in the first direction are formed on the substrate 750, however, the unprocessed gate material layer 760 at least at the positions where the gaps are to be formed is selectively left (referring to FIGS. 7I-7J). In the first etching process, an etching selection ratio of the processed gate material layer 765 to the unprocessed gate material layer 760 is, for example, larger than 2:1.

Then, in step 360 of FIG. 3, a second etching process is performed on the gate material layer so as to selectively remove the portions of the gate material layer at least at the positions where the gaps are to be formed. After the second etching process, the gate pattern as shown in FIG. 1 is formed, wherein unlike the first example, the material of the formed gate bars has undergone a process such as implantation or oxidization etc. (referring to FIGS. 7K-7L). According to specific situations, the second etching process may be a dry etching process or a wet etching process. In the second etching process, an etching selection ratio of the unprocessed gate material layer 760 to the processed gate material layer 765 is, for example, larger than 10:1.

After forming the gate pattern, optionally, the material of the gate bars may be further replaced with a metal so as to form a metal gate pattern (i.e., the gate material layer 760 is used as a dummy gate material layer). In addition, optionally, the gate oxide layer may be further replaced with a high-K dielectric layer (i.e., the gate oxide layer is used as a dummy gate oxide layer).

Figure 7I:
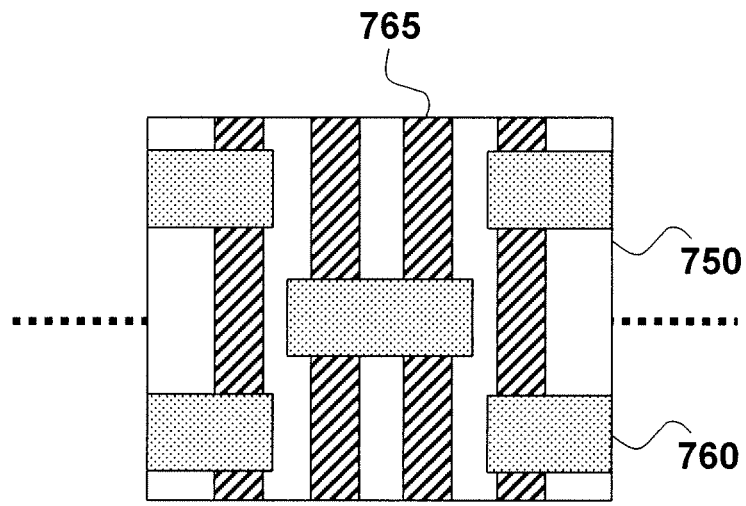
Figure 7J:
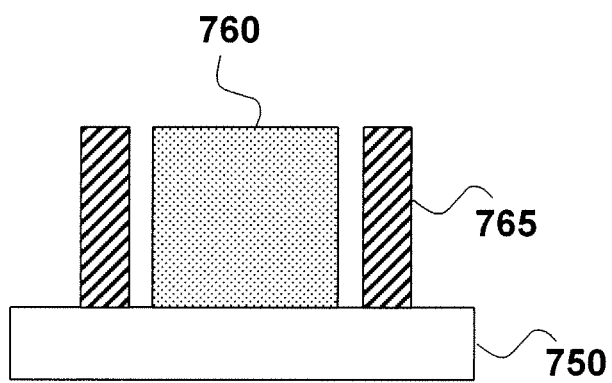
Figure 7K:
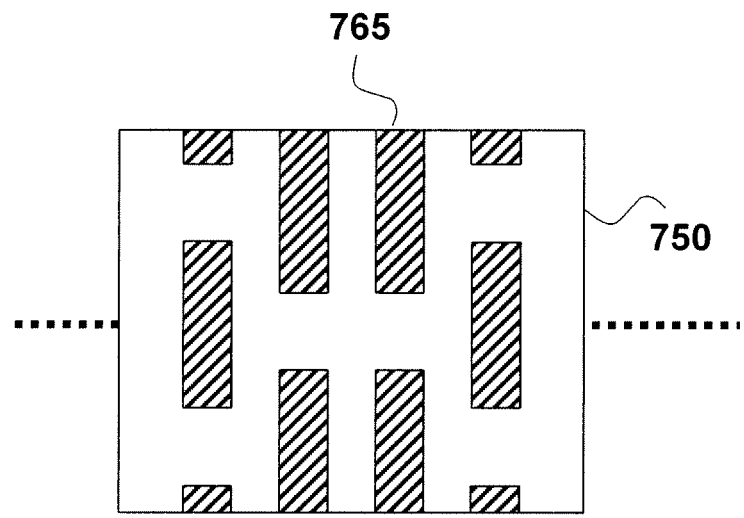
Figure 7L:
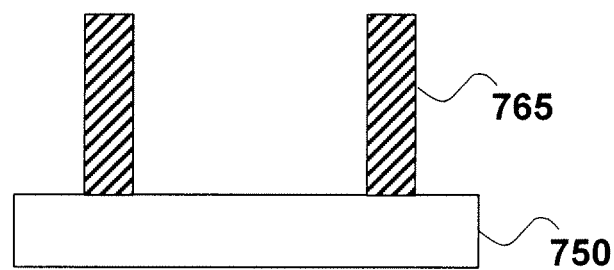

According to the method of the second example of this disclosure as described above, a semiconductor device may be formed, the semiconductor device having a gate pattern, the gate pattern comprising a plurality of gate bars parallel to each other in a first direction, and each gate bar to be broken up by gaps, wherein a gate bar material is disposed at least at positions of the gaps, and an etching characteristic of the gate bar material is different from an etching characteristic of the gate bars. Referring to FIGS. 7I-7J, for example, an implanted impurity is contained in the gate bars or the gate bars have undergone oxidization.

It can be seen from the above that, the difference between the first example and the second example lies in the way of making the etching characteristic of the gate material layer at least at the positions where the gaps are to be formed different from the etching characteristic of the gate material layer at the remaining positions. In the first example, a way of processing the gate material layer at least at the positions of the gate material layer where the gaps are to be formed is employed; whereas in the second example, a way of processing the gate material layer at the remaining positions of the gate material layer which exclude the positions where the gaps are to be formed is employed. Moreover, from the above teaching, persons skilled in the art readily know that the second example can obtain a technical effect similar to that of the first example, for example, facilitation to more accurate control of the shape and size of the gate pattern to be formed, larger process freedom etc.

Second Embodiment

Figure 8A:
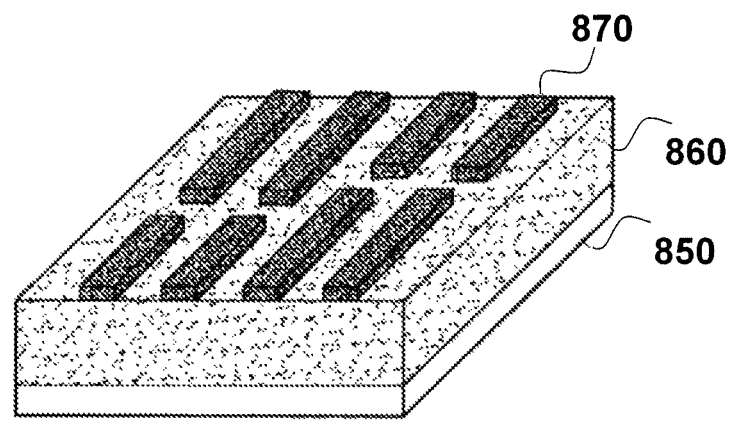
FIGS. 8A-8B schematically illustrate a method of forming a gate pattern according to a second embodiment of this disclosure.
Figure 8B:
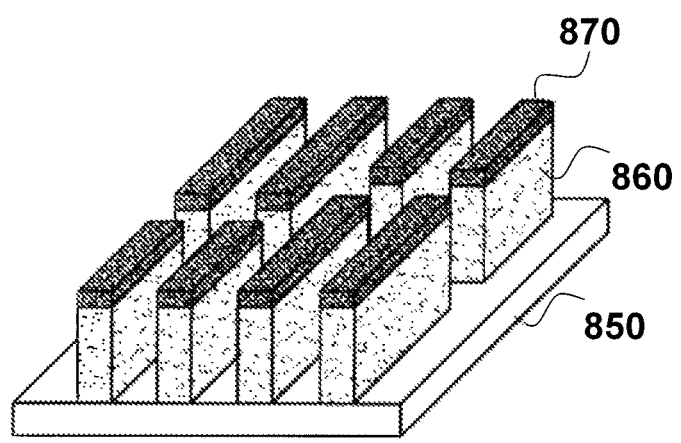

FIGS. 8A-8B schematically illustrate a method of forming a gate pattern according to a second embodiment of this disclosure.

The second embodiment of this disclosure differs from the first embodiment in that: in the second embodiment, a hard mask layer 870 is additionally formed on a gate material layer 860 on a substrate 850; and after first forming a pattern as shown in FIG. 1 in the hard mask layer 870 by using a method similar to that of the first embodiment (referring to FIG. 8A), the pattern is then transferred to the underlying gate material layer 860 (referring to FIG. 8B), thereby the gate pattern is formed.

More specifically, first, each of the steps in the first embodiment is executed on the hard mask layer 870 rather than on the gate material layer 860 so as to form the pattern as shown in FIG. 1 in the hard mask layer 870 (referring to FIG. 8A). This comprises the followings: first, an etching characteristic of the hard mask layer at least at positions where the gaps are to be formed is made different from an etching characteristic of the hard mask layer at remaining positions; then, a line etching for hard mask bars is performed; and finally, the portions of the hard mask layer at least at the positions where the gaps are to be formed are selectively removed. Here, the material of the hard mask layer is not limited particularly, and it may be, for example, a silicon nitride layer, a silicon oxide layer or a polymer layer etc. Moreover, by processing the hard mask layer at least at the positions of the hard mask layer where the gaps are to be formed or at the remaining positions of the hard mask layer, the etching characteristic of the hard mask layer at least at the positions where the gaps are to be formed can be made different from the etching characteristic of the hard mask layer at the remaining positions. Moreover, a process for changing the etching characteristic of the hard mask layer is not limited particularly, and it may be, for example, implantation, oxidization etc.

Then, a gate pattern is formed by a third etching process with the hard mask layer after the formation of the pattern as shown in FIG. 1 as a mask (referring to FIG. 8B).

The above only describes in detail the difference between the second embodiment and the first embodiment; other parts of the second embodiment are similar to those in the first embodiment, and description of the first embodiment may be referred to for details.

From the above teaching, persons skilled in the art readily know that the second embodiment can obtain a technical effect similar to that of the first embodiment, for example, facilitation to more accurate control of the shape and size of the gate pattern to be formed, larger process freedom etc.

While this disclosure has been described with reference to exemplary embodiments, it shall be understood that this disclosure is not limited to the described exemplary embodiments. It is obvious to persons skilled in the art that the above exemplary embodiments may be modified without deviating from the scope and spirit of this disclosure. The scope of the appended claims shall be accorded with the broadest interpretation so as to encompass all such modifications and equivalent structures and functions.

What is claimed is:

1. A method of forming a gate pattern, the gate pattern comprising a plurality of gate bars parallel to each other in a first direction, each gate bar being broken up by gaps, wherein the method comprises the following steps sequentially:
   forming a gate material layer on a substrate;
   making an etching characteristic of the gate material layer at least at positions where the gaps are to be formed different from an etching characteristic of the gate material layer at remaining positions;
   forming a second resist layer on the gate material layer on the substrate;
   performing a second patterning process on the second resist layer so as to form a plurality of openings parallel to each other and extending continuously in the first direction;
   performing a first etching process on the gate material layer with the second resist layer after the second patterning process as a mask, wherein portions of the gate material layer at least at the positions where the gaps are to be formed are selectively left; and
   performing a second etching process on the gate material layer so as to selectively remove the portions of the gate material layer at least at the positions where the gaps are to be formed.

2. The method of forming the gate pattern of claim 1, wherein the step of making an etching characteristic of the gate material layer at least at positions where the gaps are to be formed different from an etching characteristic of the gate material layer at remaining positions comprises:
   performing implantation or oxidization on the gate material layer at least at the positions of the gate material layer where the gaps are to be formed.

3. The method of forming the gate pattern of claim 2, wherein the step of making an etching characteristic of the gate material layer at least at positions where the gaps are to be formed different from an etching characteristic of the gate material layer at remaining positions comprises sequentially:
   forming a first resist layer on the gate material layer on the substrate;
   performing a first patterning process on the first resist layer so as to expose at least the positions of the gate material layer where the gaps are to be formed; and
   performing implantation or oxidization on the gate material layer with the first resist layer after the first patterning process as a mask.

4. The method of forming the gate pattern of claim 2, wherein an implanted impurity is selected from C, Ge, B, P and As when performing implantation.

5. The method of forming the gate pattern of claim 1, wherein the step of making an etching characteristic of the gate material layer at least at positions where the gaps are to be formed different from an etching characteristic of the gate material layer at remaining positions comprises:
   performing implantation or oxidization on the gate material layer at the remaining positions of the gate material layer.

6. The method of forming the gate pattern of claim 5, wherein the step of making an etching characteristic of the gate material layer at least at positions where the gaps are to be formed different from an etching characteristic of the gate material layer at remaining positions comprises sequentially:
   forming a first resist layer on the gate material layer on the substrate;
   performing a first patterning process on the first resist layer so as to expose the remaining positions of the gate material layer; and
   performing implantation or oxidization on the gate material layer with the first resist layer after the first patterning process as a mask.

7. The method of forming the gate pattern of claim 5, wherein an implanted impurity is selected from C, Ge, B, P and As when performing implantation.

8. The method of forming the gate pattern of claim 1, wherein an etching selection ratio in the first etching process is larger than 2:1.

9. The method of forming the gate pattern of claim 1, wherein an etching selection ratio in the second etching process is larger than 10:1.

10. The method of forming the gate pattern of claim 1, wherein the at least the positions of the gate material layer where the gaps are to be formed comprise positions where a plurality of adjacent gaps are regarded as one integrated gap.

11. The method of forming the gate pattern of claim 1, wherein the gate material layer is a polysilicon layer.

12. The method of forming the gate pattern of claim 11, wherein the material of the gate bars is replaced with a metal after forming the gate pattern.

13. The method of forming the gate pattern of claim 1,
   wherein a hard mask layer is formed on the gate material layer;
   each of the steps is executed on the hard mask layer rather than on the gate material layer; and
   the method of forming the gate pattern further comprises:
   forming the gate pattern by a third etching process with the hard mask layer after the second etching process as a mask.

14. The method of forming the gate pattern of claim 13, wherein the hard mask layer is a silicon nitride layer, a silicon oxide layer or a polymer layer.

15. A semiconductor device, the semiconductor device having a gate pattern, the gate pattern comprising a plurality of gate bars parallel to each other in a first direction, with a space between each of the parallel gate bars to provide one or more gaps,
   wherein a gate bar material is disposed at least to completely fill the gaps, said gate bar material having an etching characteristic different from an etching characteristic of the gate bars.

16. The semiconductor device of claim 15, wherein the at least the positions of the gaps comprise positions where a plurality of adjacent gaps are regarded as one integrated gap.

17. The semiconductor device of claim 15, wherein an implanted impurity is contained in the gate bars or the gate bar material.

18. The semiconductor device of claim 15, wherein the gate bars or the gate bar material are subject to oxidization.

\* \* \* \* \*